(12) United States Patent
Inoue et al.

(10) Patent No.: US 6,989,596 B2
(45) Date of Patent: Jan. 24, 2006

(54) SEMICONDUCTOR LASER MANUFACTURING METHOD AND SEMICONDUCTOR LASER

(75) Inventors: Tetsuyoshi Inoue, Yamatotakada (JP); Kazunori Matsubara, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/987,010

(22) Filed: Nov. 13, 2001

(65) Prior Publication Data

US 2002/0105985 A1     Aug. 8, 2002

(30) Foreign Application Priority Data

Nov. 21, 2000  (JP)  .............................. 2000-354191

(51) Int. Cl.
  *H01L 23/34*   (2006.01)
(52) U.S. Cl. ...................................... 257/724; 372/75
(58) Field of Classification Search ................ 372/36, 372/45; 257/780, 706, 667; 438/122, 612
See application file for complete search history.

(56) References Cited

U.S. PATENT DOCUMENTS

| | | | |
|---|---|---|---|
| 5,138,428 A * | 8/1992 | Hainz et al. ................ | 257/780 |
| 6,014,318 A * | 1/2000 | Takeda ....................... | 361/764 |
| 6,064,111 A * | 5/2000 | Sota et al. .................. | 257/667 |
| 6,099,678 A * | 8/2000 | Kotato et al. ............... | 156/256 |
| 6,143,590 A * | 11/2000 | Ohki et al. .................. | 438/122 |
| 6,187,611 B1 * | 2/2001 | Preston et al. .............. | 438/106 |
| 6,239,012 B1 * | 5/2001 | Kinsman ..................... | 438/612 |
| 6,255,742 B1 * | 7/2001 | Inaba ......................... | 257/796 |
| 6,349,104 B1 * | 2/2002 | Kato et al. .................... | 372/36 |
| 6,380,620 B1 * | 4/2002 | Suminoe et al. ............ | 257/706 |
| 6,426,552 B1 * | 7/2002 | Reeder et al. .............. | 257/724 |

FOREIGN PATENT DOCUMENTS

| | | |
|---|---|---|
| EP | 0 905 833 A2 | 3/1999 |
| EP | 0905833 A2 * | 3/1999 |
| JP | 08-095504 | 4/1996 |
| JP | 08-095504 * | 12/1996 |
| JP | 11-168263 | 6/1999 |

* cited by examiner

*Primary Examiner*—Minsun Oh Harvey
*Assistant Examiner*—Tuan N. Nguyen
(74) *Attorney, Agent, or Firm*—Morrison & Foerster LLP

(57) ABSTRACT

Silver paste is applied to a stem, and a semiconductor laser chip is mounted onto the stem on which the silver paste has been applied. Next, the semiconductor laser chip mounted on the stem, while kept pressurized toward the stem with a collet, is heated to make the silver paste temporarily cured, by which the semiconductor laser chip is fixed onto the stem. Then, after a temporary curing step, the silver paste is finally cured within a thermostat. The semiconductor laser device thus manufactured is low in thermal resistance and reduced in variations of operating current and prevented from short-circuiting of the semiconductor laser chip.

7 Claims, 7 Drawing Sheets

SEMICONDUCTOR LASER MANUFACTURING METHOD AND SEMICONDUCTOR LASER

BACKGROUND OF THE INVENTION

The present invention relates to a manufacturing method for a semiconductor laser device assembled by using a die-bond paste excellent in mass productivity, and also to a semiconductor laser device.

Conventionally, there has been provided a semiconductor laser device, as shown in FIG. 7, in which a semiconductor laser chip 24 is die-bonded to a submount 23 provided on a stem 21, and further covered with a cap 25. A laser beam emitted from the semiconductor laser chip 24 is outputted through glass 26 provided in the cap 25. Then, a monitoring-use photodiode 22 on the stem 21 detects the light outputted from one side of the semiconductor laser chip 24 opposite to the glass 26 side to use the light for estimation of the intensity of the light emitted to the glass 26 side.

As another semiconductor laser device, there has also been provided an integrated semiconductor laser device called hologram laser as shown in FIG. 8. In this semiconductor laser device, a hologram device 34 is integrated with a semiconductor laser device similar in construction to that shown in FIG. 7. The semiconductor laser device using the hologram device 34 is used primarily as a light source for optical disks, in which case light emitted from a semiconductor laser chip 32 is applied to the optical disk via the hologram device 34. Then, light reflected from the optical disk is deflected and converged toward an OPIC photodetection chip 33 (photodetector in which a plurality of photodetection parts and signal processing circuits are integrated) by a diffraction effect with a hologram 34a formed on the surface of the hologram device 34, thereby detecting a signal recorded on the optical disk. The semiconductor laser chip 32 is die-bonded to a stem 31, whereas a submount for die-bonding use is omitted in FIG. 8 for simplicity' sake.

FIGS. 9A–9C are views for explaining a manufacturing method for semiconductor laser devices of FIGS. 7 and 8, where FIGS. 9A–9C depict only a portion at which the semiconductor laser chip is die-bonded. As the brazing filler metal for die-bonding, metals good at heat conduction and electrical conduction such as gold-tin alloys, solder and indium are often used, but metallic brazing filler materials are unfortunately difficult to use because of their high melting temperatures, which are generally beyond 200° C. Further, brazing filler materials using indium, which is low in melting temperature, would soften during use, causing the semiconductor laser chip to moved. Silver paste, which is an electrically conductive die-bond paste using metal, on the other hand, is easy to use even at room temperature by virtue of its paste form, and will cure at relatively low temperature of about 150° C. Even if exposed to high temperatures, silver paste, which indeed may cure, but will not soften, thus eliminating the problem that the semiconductor laser chip may be caused to move. Thus, silver paste has been widely used in recent years.

Now, a manufacturing method for a semiconductor laser device is described with reference to FIGS. 9A–9C.

First of all, as shown in FIG. 9A, a silver paste 42 is applied onto a stem 41 (or onto a submount) at room temperature.

Next, as shown in FIG. 9B, a semiconductor laser chip 43 is placed at a position where the silver paste 42 has been applied, and pressurized into a form of a semiconductor laser device. This pressurization is done in order to instantaneously purge out the silver paste that has entered into a gap between the semiconductor laser chip 43 and the stem 41 (or the submount).

Next, as shown in FIG. 9C, the semiconductor laser device fabricated at FIG. 9B is placed within thermostat 45 and then heating is performed to make the silver paste 42 cured, by which die bonding is completed. Curing conditions for silver paste in this case are set to 150° C. and about 1 hour.

SUMMARY OF THE INVENTION

The silver paste to be used for die bonding of the semiconductor laser device is so made by filling resin with silver powder given in such a form as needle crystals or flakes. Therefore, the silver paste has a drawback of being large in electrical resistance and thermal resistance, compared with metallic brazing filler materials. Particularly as to the thermal resistance, while semiconductor laser devices using indium as the brazing filler material has a thermal resistance of about 60° C./W, while semiconductor laser devices using silver paste has a thermal resistance of 100° C./W or higher, which has found to be problematic. Such high thermal resistances would make it difficult for heat generated at the active layer to transfer to the stem, causing the temperature of the active layer to increase more and more so that the semiconductor laser chip may fail.

Also, when heating is performed in the thermostat to make the silver paste cured so that the semiconductor laser chip is fixed onto the stem, the semiconductor laser chip is not held and the semiconductor laser chip is left only placed on the silver paste. As a result, silver paste interposed between the semiconductor laser chip and the stem does not become uniform in thickness. This would lead to instability in the bonding state of the semiconductor laser chip and the stem, which in turn would lead to instability of electrical resistance, resulting in a problem of variations in operating current.

Further, there is a problem that the silver paste creeps up on side faces of the semiconductor laser chip so as to reach the active layer of the semiconductor laser chip, making the semiconductor laser chip short-circuited by the silver paste. This is due to the fact that whereas warming the whole semiconductor laser device in the thermostat makes the silver paste go creeping up, the height of the creep-up cannot be controlled.

Therefore, an object of the invention is to provide a manufacturing method for a semiconductor laser device, as well as a semiconductor laser device, which can be lowered in thermal resistance and reduced in variations of operating current and further prevented from short-circuiting of the semiconductor laser chip.

In order to achieve the above object, the present invention provides a manufacturing method for a semiconductor laser device in which a semiconductor laser chip is mounted on a base portion by using an electrically conductive die-bond paste using a metal, the method comprising the step of:

applying the conductive die-bond paste onto the base portion;

mounting the semiconductor laser chip onto the base portion on which the conductive die-bond paste has been applied;

heating the semiconductor laser chip mounted on the base portion while the semiconductor laser chip is kept pressurized toward the base portion, thereby temporarily curing the conductive die-bond paste; and after the temporary curing, finally curing the conductive die-bond paste.

In this semiconductor laser device manufacturing method, the conductive die-bond paste (silver paste, copper paste or silver palladium paste, etc.) using a metal is applied to the base portion such as a stem, submount or wiring board, and the semiconductor laser chip is mounted onto the base portion on which the conductive die-bond paste has been applied. Then, the semiconductor laser chip, while kept pressurized toward the base portion, is heated to make the conductive die-bond paste temporarily cured, by which the semiconductor laser chip is fixed immobile to the base portion, and thereafter the conductive die-bond paste is finally cured. Since the conductive die-bond paste interposed between the semiconductor laser chip and the base portion can be maintained 5 $\mu$m or less thick by pressurizing the semiconductor laser chip from above toward the base portion in the temporary curing step, a stable bonding state can be achieved. Therefore, the thermal resistance can be lowered and moreover the thermal resistance and the electrical resistance can be stabilized so that variations in operating current can be suppressed. Further, since the conductive die-bond paste has already become high in viscosity as a result of the temporary curing, the creep-up height of the conductive die-bond paste at the side face of the semiconductor laser chip from the die-bond surface can be made not more than 40 $\mu$m when the conductive die-bond paste is cured, for example, by heating the whole within the thermostat in the temporary curing step after the temporary curing step. Therefore, the creep-up of the conductive die-bond paste never becomes higher than the position of the active layer of the semiconductor laser chip, the semiconductor laser chip can be prevented from short-circuiting.

Also, there is provided a semiconductor laser device comprising a semiconductor laser chip mounted on a base portion by using an electrically conductive die-bond paste using a metal, wherein thermal resistance of the semiconductor laser device is 90° C./W or lower.

In the case where the semiconductor laser chip is mounted onto the base portion by using the conductive die-bond paste using a metal, conventional die bond using, for example, silver paste would involve a thermal resistance of 100° C./W or higher, which is practically problematic in reliability. In contrast to this, in the semiconductor laser device of the above constitution, the thermal resistance of the semiconductor laser device in which the semiconductor laser chip is mounted on the base portion can be made 90° C./W or lower by using a conductive die-bond paste using a metal, by which heat generated at the active layer of the semiconductor laser chip can easily be purged toward the base portion via the conductive die-bond paste. Thus, a semiconductor laser device of high reliability can be obtained.

In one embodiment of the present invention, creep-up height of the conductive die-bond paste at a side face of the semiconductor laser chip from a die-bond surface of the semiconductor laser chip is not more than 40 $\mu$m.

In the semiconductor laser device of this embodiment, since the active layer of the semiconductor laser chip is generally positioned higher than at least 40 $\mu$m from the die-bond surface, the conductive die-bond paste can be made no higher than the position of the active layer by the arrangement that the creep-up height of the conductive die-bond paste at the side face of the semiconductor laser chip from the die-bond surface is 40 $\mu$m or lower. Thus, the semiconductor laser chip can be prevented from short-circuiting.

In one embodiment of the present invention, the conductive die-bond paste interposed between a die-bond surface of the semiconductor laser chip and the base portion is 5 $\mu$m or lower thick.

In the semiconductor laser device of this embodiment, by the arrangement that the conductive die-bond paste interposed between the die-bond surface of the semiconductor laser chip and the base portion is made 5 $\mu$m or less thick, a stable bonding state between the die-bond surface of the semiconductor laser chip and the base portion can be achieved, allowing a stable electrical resistance to be obtained. Thus, operating variations can be reduced.

In one embodiment of the present invention, the conductive die-bond paste using a metal is silver paste.

In the semiconductor laser device of this embodiment, silver paste that is the conductive die-bond paste using a metal is pasty even at room temperature and curable at relatively low temperatures, thus being easy to handle. This allows the productivity to be improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, a semiconductor laser device manufacturing method as well as a semiconductor laser device according to the present invention are described in detail by way of embodiments thereof illustrated in the accompanying drawings.

Figure 1:
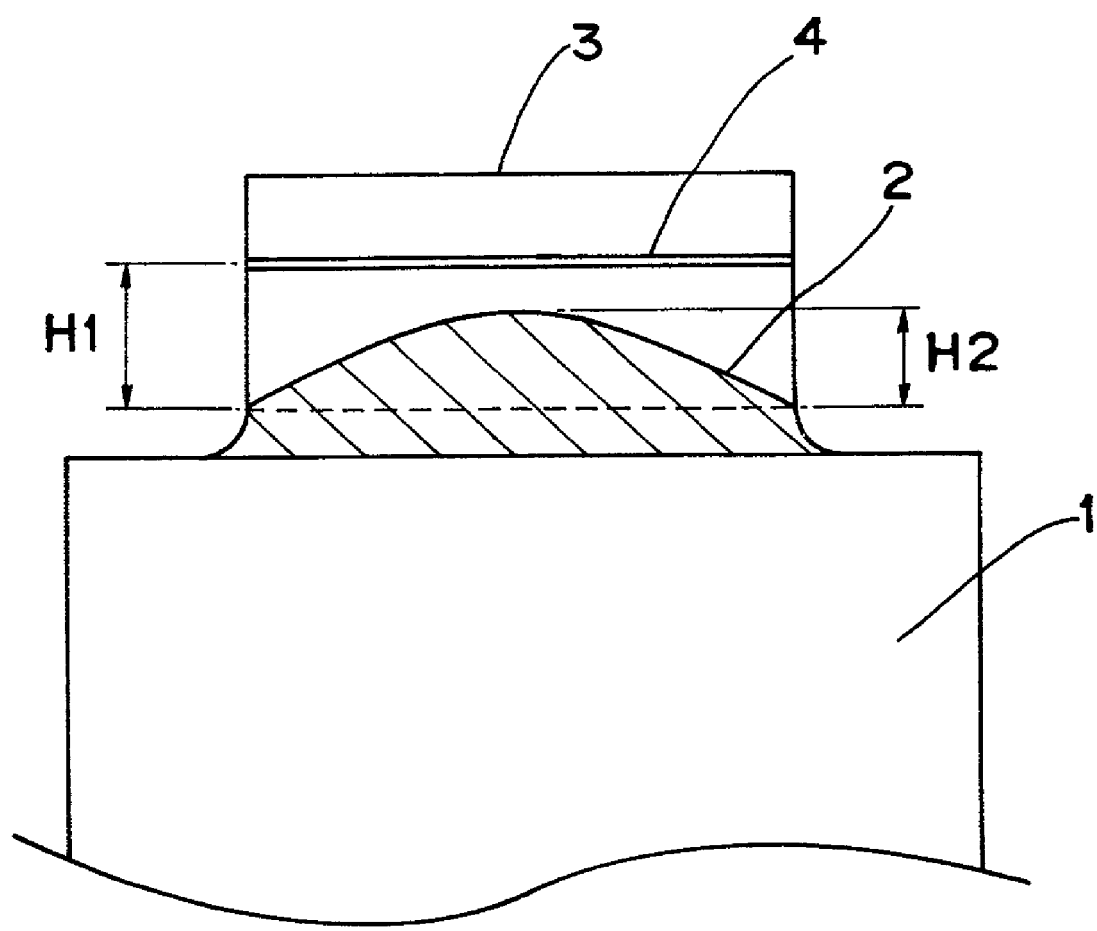
FIG. 1 is a side view of main part of a semiconductor laser device which is an embodiment of the present invention.

FIG. 1 is a side view of main part of a semiconductor laser device which is an embodiment of the present invention, where reference numeral 1 denotes a stem as a base portion, 2 denotes silver paste as an electrically conductive die-bond paste using a metal applied onto the stem 1, and 3 denotes a semiconductor laser chip mounted on the stem 1 via the silver paste 2.

Next, the manufacturing method for this semiconductor laser device is explained with reference to FIGS. 2A, 2B, 2C and 2D.

up the chip with a collet in temporary curing step, then removing the collet into a no-pressure state, simultaneously performing a heating step under the same heating conditions as with Example, and thereafter performing a finally curing step, and the semiconductor laser device of Background Art Example is one fabricated by once setting up the chip with a collet in the temporary curing step, and then finally curing the chip as it is.

TABLE 1

| Sample preparation method Sample No. | Example | | Comparative example 1 | | Comparative example 2 | | Background art example | |
|---|---|---|---|---|---|---|---|---|
| | Creep-up amount ($\mu$m) | Thermal resistance (° C./W) | Creep-up amount ($\mu$m) | Thermal resistance (° C./W) | Creep-up amount ($\mu$m) | Thermal resistance (° C./W) | Creep-up amount ($\mu$m) | Thermal resistance (° C./W) |
| 1 | 20 | 88.3 | 57 | 128.6 | 34 | 91.5 | 35 | 120.4 |
| 2 | 24 | 79.3 | 46 | 118.6 | 33 | 87.6 | 33 | 122.8 |
| 3 | 26 | 79.1 | 55 | 107.1 | 33 | 90.4 | 25 | 125.7 |
| 4 | 30 | 80.0 | 48 | 108.0 | 30 | 91.2 | 42 | 114.8 |
| 5 | 28 | 76.1 | 54 | 106.5 | 31 | 86.6 | 44 | 109.7 |
| 6 | 36 | 74.9 | 50 | 105.3 | 31 | 92.1 | 43 | 118.7 |
| 7 | 35 | 78.9 | 62 | 118.4 | 22 | 96.8 | 32 | 110.0 |
| 8 | 34 | 75.8 | 59 | 105.5 | 35 | 103.2 | 28 | 124.1 |
| 9 | 37 | 77.7 | 55 | 107.9 | 33 | 91.3 | 35 | 117.5 |
| 10 | 40 | 80.5 | | | 33 | 92.3 | | |
| Mean | 31.0 | 79.1 | 54.0 | 111.8 | 31.5 | 92.3 | 35.2 | 118.2 |

Figure 2A:
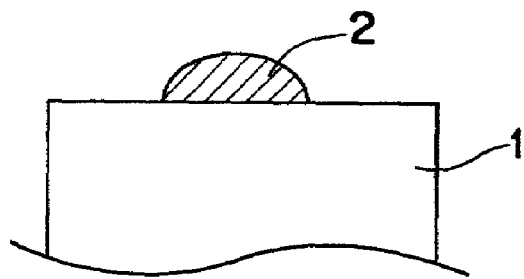
FIGS. 2A, 2B, 2C and 2D are views showing manufacturing steps for the semiconductor laser device.

First of all, as shown in FIG. 2A, the silver paste 2 is applied onto the stem 1. The silver paste 2 in this case is applied into a 0.15 mm-dia. dome shape, its volume being set to $1.77 \times 10^{-3}$ mm$^3$. The silver paste used in this case is T-3040 made by Sumitomo Kinzoku Kozan K. K. (silver content ratio: 82–84%).

Figure 2B:
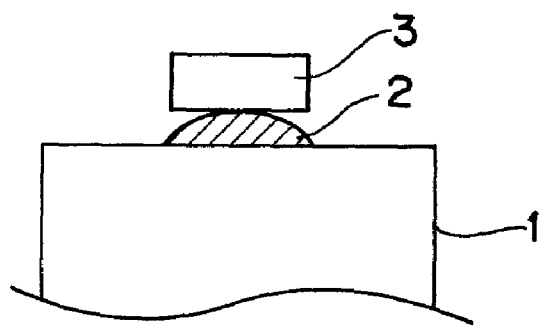

Next, as shown in FIG. 2B, the semiconductor laser chip 3 is mounted on the stem 1 via the silver paste 2.

Figure 2C:
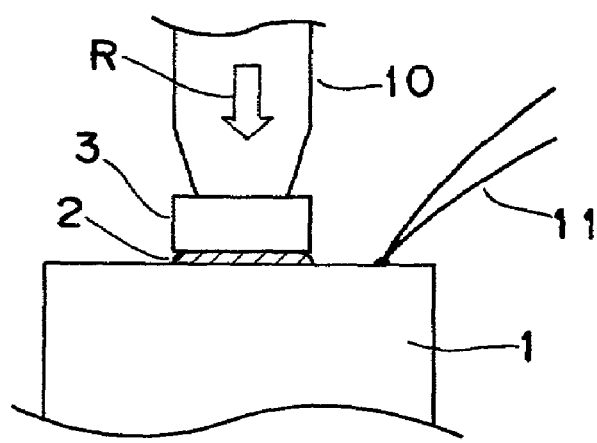

Next, as shown in FIG. 2C, the semiconductor laser chip 3 is temporarily cured, while pressurized toward a direction of arrow R by a collet 10, by heating the stem 1. The pressurization in this case is done by applying a 50 g weight (not shown) to the collet 10 having a diameter of about 0.2 mm. The heating process is carried out at temperatures of 200° C. or higher for 10 seconds by measuring the temperature of the stem 1 (heat sink) by a thermocouple 11, where temperature increase and decrease are accelerated as much as possible.

Figure 2D:
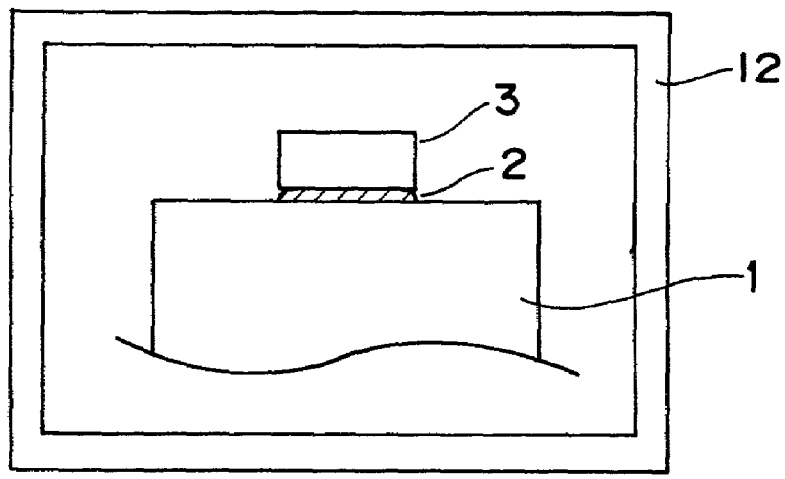

Then, as shown in FIG. 2D, the semiconductor laser device (1, 2, 3) over the temporary curing is heated within a thermostat 12 so as to be finally cured. Heating in this case is performed by setting the temperature in the thermostat 12 to 150° C. and leaving the semiconductor laser device for 1 hour. Further, collectively curing a large amount of temporarily cured semiconductor laser devices makes it possible to maintain the curing time per device substantially short.

Table 1 given below shows experimental results of measuring creep-up amount and thermal resistance in the semiconductor laser devices of Example, Comparative Example 1, Comparative Example 2, and Background Art Example. In this experiment, the semiconductor laser device of Example is one fabricated by the above-described manufacturing method, and the semiconductor laser device of Comparative Example 1 is one fabricated by a pressurizing step under the same conditions as with Example in the steps of temporary curing, and a finally curing step without heating. Further, the semiconductor laser device of Comparative Example 2 is one fabricated through the steps of once setting Now the method of measuring the thermal resistance in the above experiment is explained with reference to FIGS. 10A, 10B and 10C.

Figure 10A:
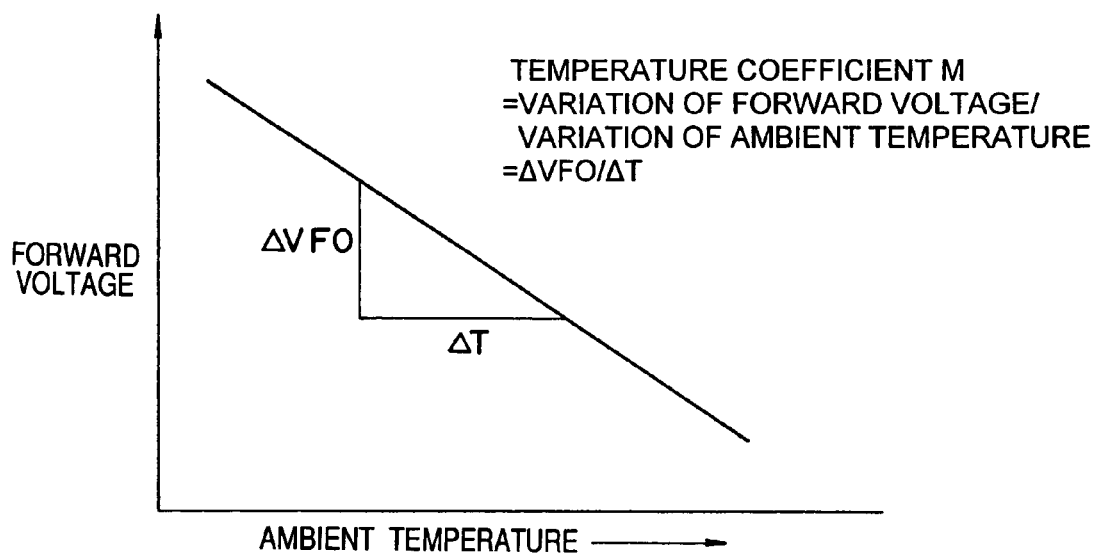
FIGS. 10A, 10B and 10C are charts for explaining the method of measuring thermal resistance.

First, a semiconductor laser device is placed in a thermostat, and a forward voltage VF resulting when a constant small current Im is passed through the semiconductor laser device is measured. As shown in FIG. 10A, measurement is performed with temperature varied, by which temperature coefficient M ($=\Delta VFO/\Delta T$) of VF is measured. This measurement of temperature coefficient M does not need to be performed with individual semiconductor laser devices, but is done only once with a semiconductor laser device fabricated under the same conditions.

Figure 10B:
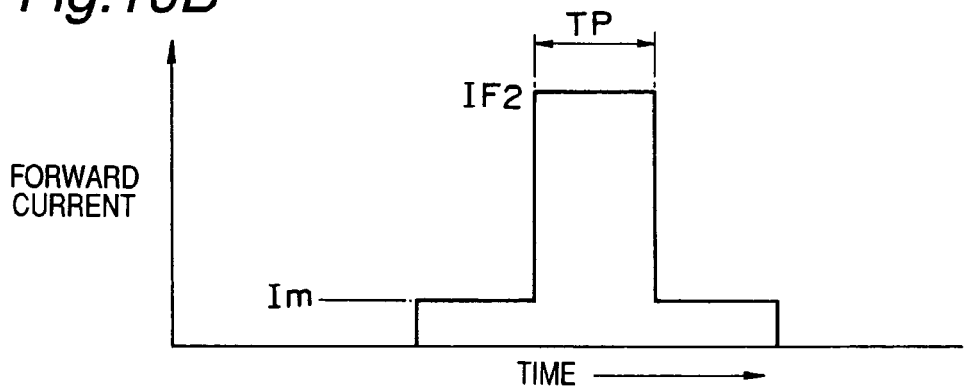

Next, as shown in FIG. 10B, such a small current Im (about 5 mA or less) that heat generation of the semiconductor laser device is negligible is passed, and subsequently a forward current IF2 of several tens of mA is passed for a specified time TP. A resulting forward voltage to the forward current IF2 in this case is assumed as VF2.

Figure 10C:
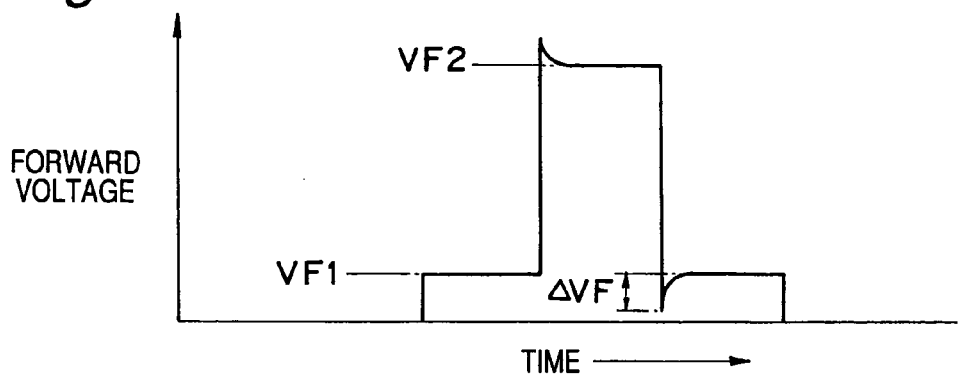

Also, FIG. 10C shows variations in the forward voltage VF, where the passage of the forward current IF2 causes the forward voltage to increase as well, which in turn causes the semiconductor laser chip to increase in temperature so that the forward voltage VF decreases exponentially and comes to a generally constant value during the measurement time TP. This resulting constant forward voltage is assumed as VF2. Also, when the forward current is lowered to Im, the forward voltage once comes to a value lower than VF1 and thereafter exponentially increases to return to the constant value. If the variation of the forward voltage in this case is assumed as $\Delta VF$, then the thermal resistance Rth can be determined by an equation:

$$Rth = (\Delta VF/M)/(IF2 \times VF2) (° C./W).$$

From the results of Table 1 obtained in this way, it can be understood that Example can provide the lowest thermal resistance, which is at most 90° C./W or lower. Also, Example and Comparative Example 2 show smaller creep-up amounts, finding that the creep-up amount can be suppressed by the heating during the temporary curing step.

Furthermore, FIGS. 3 to 6 show experiment results of measuring variations of operating current resulting while the semiconductor laser devices of Example, Comparative Example 1, Comparative Example 2 and Background Art Example are kept electrically conducting for a long time under laser oscillation. In FIGS. 3 to 6, the horizontal axis represents conduction time and the vertical axis represents the operating current.

Figure 3:
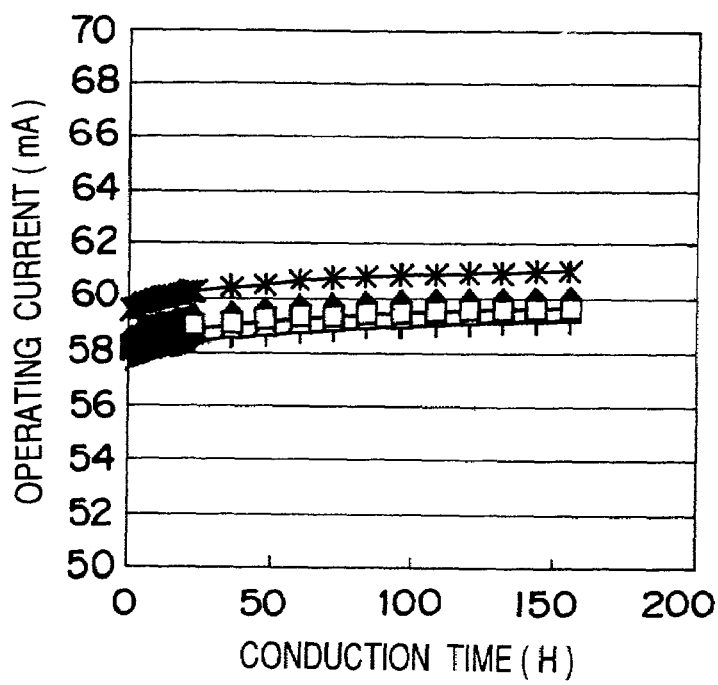
FIG. 3 is a chart showing variations of operating current resulting while the semiconductor laser device is kept electrically conducting for a long time under laser oscillation.
Figure 4:
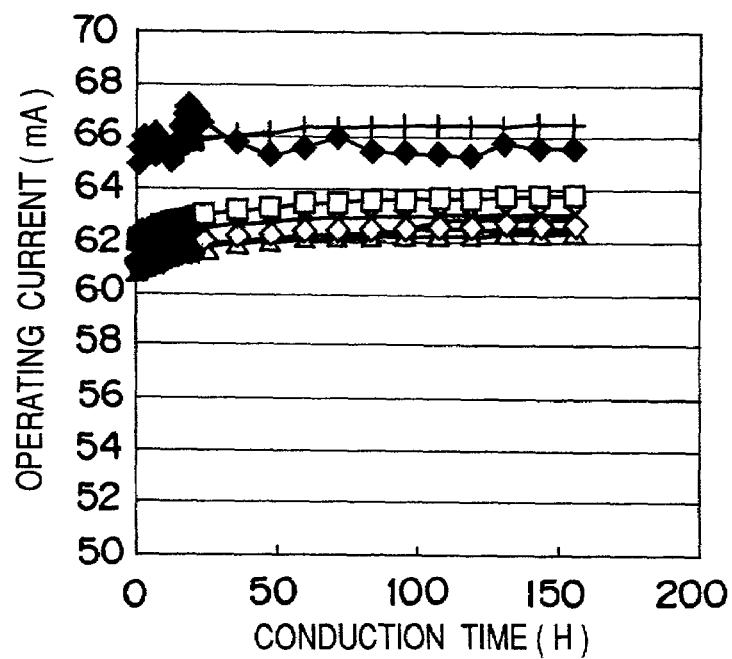
FIG. 4 is a chart showing variations of operating current resulting while a semiconductor laser device of Comparative Example 1 is kept electrically conducting for a long time under laser oscillation.
Figure 5:
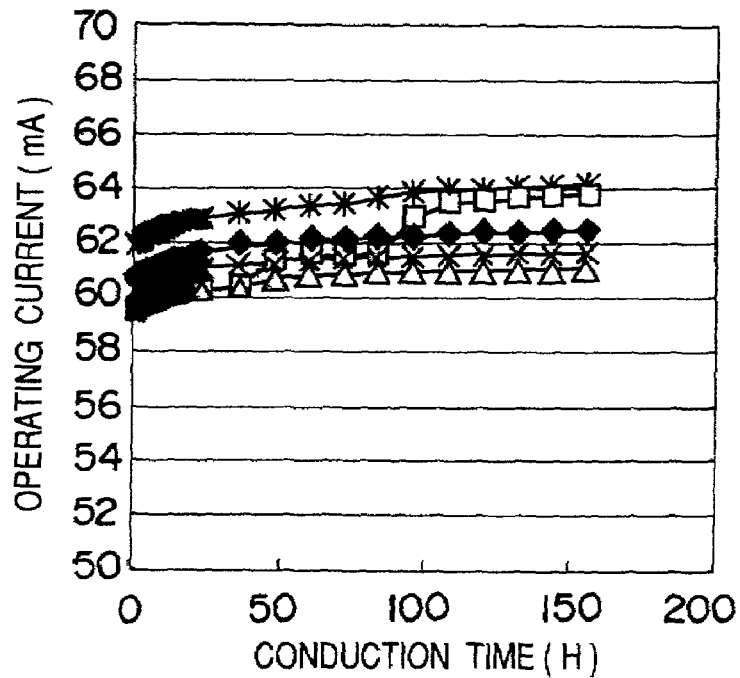
FIG. 5 is a chart showing variations of operating current resulting while a semiconductor laser device of Comparative Example 2 is kept electrically conducting for a long time under laser oscillation.
Figure 6:
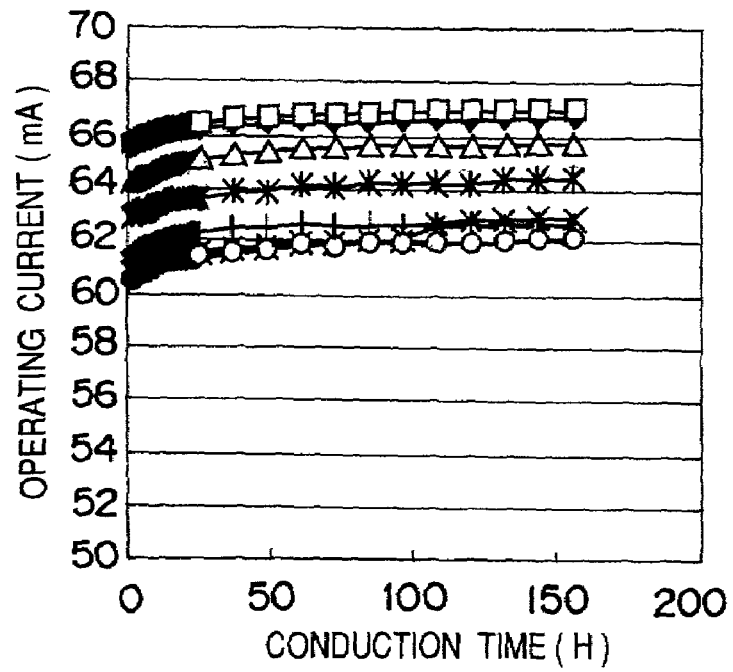
FIG. 6 is a chart showing variations of operating current resulting while a semiconductor laser device of Background Art Example is kept electrically conducting for a long time under laser oscillation.
Figure 7:
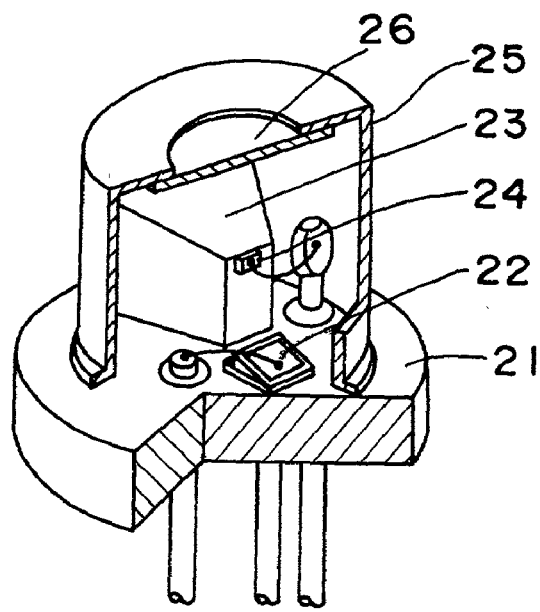
FIG. 7 is a fragmentary broken view of a semiconductor laser device according to the background art.
Figure 8:
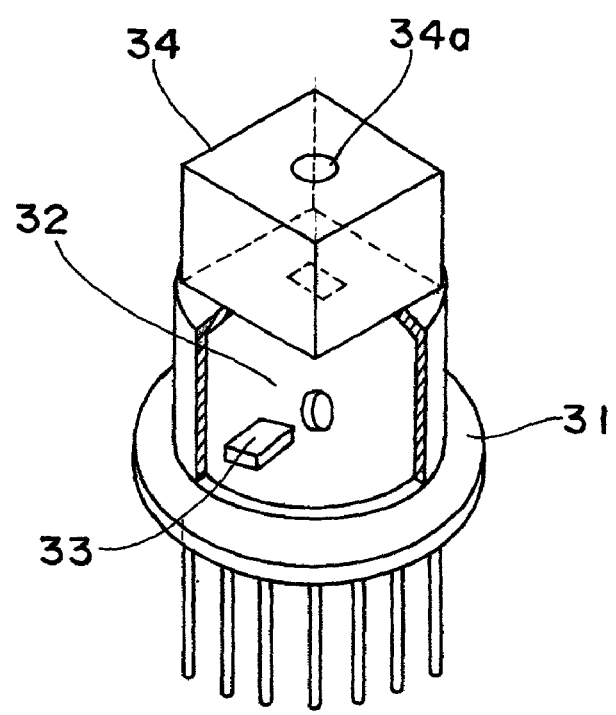
FIG. 8 is a fragmentary broken view of a semiconductor laser device using a hologram element according to the background art.
Figure 9A:
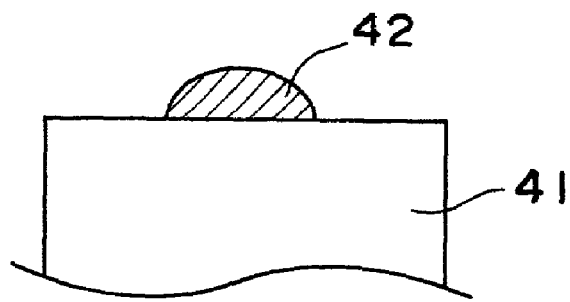
FIGS. 9A, 9B and 9C are views showing manufacturing steps for the semiconductor laser device of the background art.
Figure 9B:
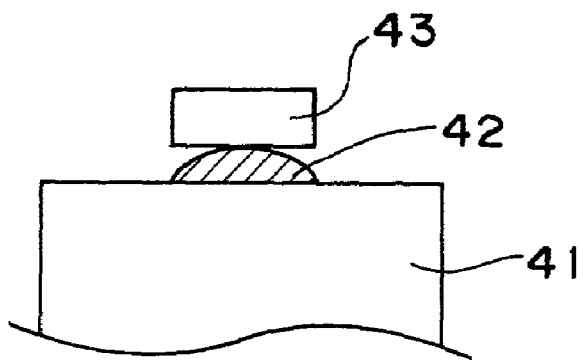
Figure 9C:
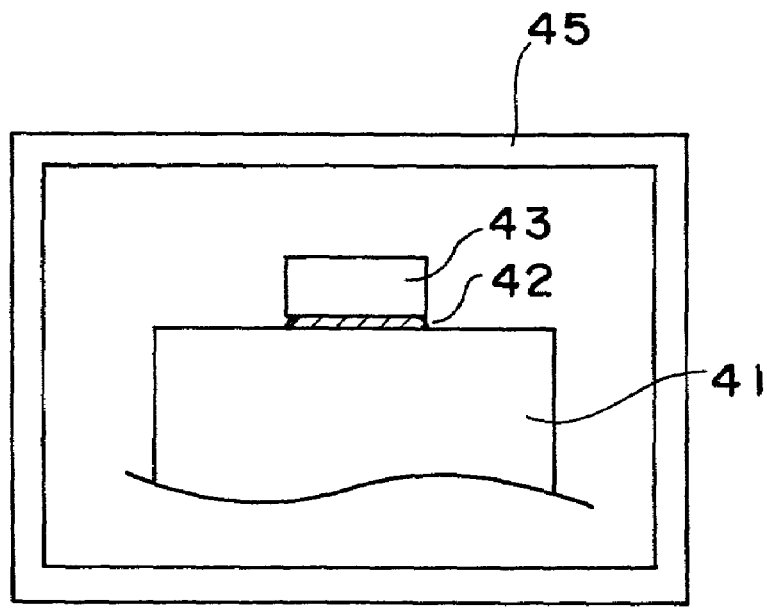

As apparent from FIGS. 3 to 6, from the viewpoint of operating current where the conduction time is zero, Example of FIG. 3 shows the least variations, finding that a stable bonding state has been achieved. Example also shows the least increase in operating current after a 150 hour conduction, exhibiting an effect of reduction in thermal resistance.

Thus, with the semiconductor laser device manufacturing method as shown above, since the silver paste 2 interposed between the semiconductor laser chip 3 and the stem 1 can be maintained 5 μm or less thick by pressurizing the semiconductor laser chip 3 from above toward the stem 1 side in the temporary curing step, a stable bonding state can be achieved so that the thermal resistance can be lowered, and further that variations in operating current can be suppressed.

Further, since the creep-up amount of the silver paste 2 can be lessened by a short-time (10 seconds) heating at 200° C. or higher in the temporary curing step of FIG. 2C, the creep-up amount of the silver paste 2 can be suppressed small. Further, since the silver paste that has increased in viscosity due to this temporary curing is cured by heating the whole within the thermostat 12 in the final curing step of FIG. 2D, the creep-up amount can be reduced more largely than the cases in which only the final curing is involved. In this semiconductor laser device, since a creep-up height H2 (shown in FIG. 1) of the silver paste 2 at a side face of the semiconductor laser chip 3 from the die-bond surface can be made 40 μm or lower, the silver paste 2 never becomes higher than a height H1 from the die-bond surface to an active layer 4 of the semiconductor laser chip 3, so that the semiconductor laser chip 3 can be prevented from short-circuiting.

In the above embodiment, the semiconductor laser chip 3 is mounted on the stem 1 serving as a base portion. However, the present invention may be applied to semiconductor laser devices in which the semiconductor laser chip is mounted on such a base portion as a submount, printed circuit board or lead frame.

Further, although silver paste is used as a conductive die-bond paste using metal in the above embodiment, copper paste, silver palladium paste or the like may also be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method for a semiconductor laser device in which a semiconductor laser chip is mounted on a base portion by using an electrically conductive die-bond paste including metal filler, the method comprising:

applying the conductive die-bond paste onto the base portion;

mounting the semiconductor laser chip onto the base portion on which the conductive die-bond paste has been applied;

heating the semiconductor laser chip mounted on the base portion while the semiconductor laser chip is kept pressurized by a collet bearing a weight toward the base portion, thereby temporarily curing the conductive die-bond paste; and after the temporary curing, finally curing the conductive die-bond paste in a thermostat without pressurizing by the collet.

2. A semiconductor laser device comprising a semiconductor laser chip mounted on a base portion by using an electrically conductive die-bond paste including metal filler, wherein thermal resistance of the semiconductor laser device is 90° C./W or lower, and the conductive die-bond paste interposed between a die-bond surface of the semiconductor laser chip and the base portion is 5 μm or lower thick.

3. A semiconductor laser device comprising a semiconductor laser chip mounted on a base portion by using an electrically conductive die-bond paste including metal filler, wherein thermal resistance of the semiconductor laser device is 90° C./W or lower, and creep-up height of the conductive die-bond paste at a side face of the semiconductor laser chip from a die-bond surface of the semiconductor laser chip is not more than 40 μm.

4. The semiconductor laser device according to claim 2, wherein the metal filler included in the conductive die-bond paste is silver paste.

5. The semiconductor laser device according to claim 3, wherein the metal filler included in the conductive die-bond paste is silver paste.

6. The semiconductor laser devise according to claim 2, wherein the content ratio of silver in the conductive die-bond paste is 82%–84%.

7. The semiconductor laser devise according to claim 3, wherein the content ratio of silver in the conductive die-bond paste is 82%–84%.

* * * * *